United States Patent
Aoki et al.

(10) Patent No.: US 11,869,702 B2
(45) Date of Patent: *Jan. 9, 2024

(54) COIL COMPONENT, CIRCUIT BOARD, AND ELECTRONIC DEVICE

(71) Applicant: TAIYO YUDEN CO., LTD., Tokyo (JP)

(72) Inventors: Hidenori Aoki, Tokyo (JP); Tomoo Kashiwa, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/076,983

(22) Filed: Dec. 7, 2022

(65) Prior Publication Data

US 2023/0109335 A1 Apr. 6, 2023

Related U.S. Application Data

(63) Continuation of application No. 17/129,142, filed on Dec. 21, 2020, now Pat. No. 11,551,853.

(30) Foreign Application Priority Data

Dec. 27, 2019 (JP) .................................. 2019-239125

(51) Int. Cl.
| | | |
|---|---|---|
| *H05K 1/18* | (2006.01) | |
| *H01F 27/28* | (2006.01) | |
| *H01F 27/29* | (2006.01) | |

(52) U.S. Cl.
CPC ......... *H01F 27/2804* (2013.01); *H01F 27/29* (2013.01); *H05K 1/181* (2013.01);
(Continued)

(58) Field of Classification Search
CPC . H01F 27/2804; H01F 27/2809; H05K 1/181; H05K 2201/1003
See application file for complete search history.

(56) References Cited

U.S. PATENT DOCUMENTS

| | | |
|---|---|---|
| 2015/0102888 A1 | 4/2015 | Kim et al. |
| 2016/0314889 A1 | 10/2016 | Ryu et al. |
| | (Continued) | |

FOREIGN PATENT DOCUMENTS

| | | |
|---|---|---|
| JP | 2008-091433 A | 4/2008 |
| JP | 2015-079931 A | 4/2015 |
| | (Continued) | |

OTHER PUBLICATIONS

Notice of Reasons for Refusal dated Aug. 22, 2023, issued in corresponding Japanese Patent Application No. 2019-239125 with English translation (7 pgs.).

*Primary Examiner* — Hoa C Nguyen

(74) *Attorney, Agent, or Firm* — Pillsbury Winthrop Shaw Pittman, LLP

(57) ABSTRACT

A coil component includes a base body containing metal magnetic particles and a binder binding together the metal magnetic particles and having a first surface extending along a coil axis and a second surface opposing the first surface, a first external electrode, a second external electrode, and a coil conductor electrically connected to the first and second external electrodes. In one embodiment, the coil conductor has a winding portion, the winding portion has first conductor portions and one or more second conductor portions smaller in number than the first conductor portions. The first and second conductor portions alternate with and are connected to each other. A ratio of a first distance between the first conductor portions and the first surface to a second (Continued)

distance between the second conductor portions and the second surface is from 0.5 to less than 1.

14 Claims, 8 Drawing Sheets

(52) U.S. Cl.
CPC ............... *H01F 2027/2809* (2013.01); *H05K 2201/1003* (2013.01)

(56) References Cited

U.S. PATENT DOCUMENTS

| | | |
|---|---|---|
| 2017/0345549 A1 | 11/2017 | Moon |
| 2018/0068775 A1 | 3/2018 | Kwon et al. |
| 2018/0096769 A1 | 4/2018 | Seikiguchi |
| 2018/0174740 A1* | 6/2018 | Muneuchi ........... H01F 27/2828 |
| 2018/0197675 A1 | 7/2018 | Kido |
| 2019/0103216 A1 | 4/2019 | Matsuda |
| 2019/0198219 A1* | 6/2019 | Shirai ..................... H01F 27/24 |
| 2019/0259529 A1 | 8/2019 | Cho |
| 2020/0027653 A1* | 1/2020 | Terauchi ............... H01F 41/046 |
| 2020/0152374 A1 | 5/2020 | Sato |
| 2020/0243250 A1 | 7/2020 | Igarashi |

FOREIGN PATENT DOCUMENTS

| | | |
|---|---|---|
| JP | 2016-208002 A | 12/2016 |
| JP | 2017-216427 A | 12/2017 |
| JP | 2018-041955 A | 3/2018 |
| JP | 2018-101732 A | 6/2018 |

* cited by examiner

COIL COMPONENT, CIRCUIT BOARD, AND ELECTRONIC DEVICE

CROSS-REFERENCE TO RELATED APPLICATIONS

This application is a continuation of U.S. patent application Ser. No. 17/129,142 (filed on Dec. 21, 2020), which claims the benefit of priority from Japanese Patent Application Serial No. 2019-239125 (filed on Dec. 27, 2019), the contents of which are hereby incorporated by reference in their entirety.

TECHNICAL FIELD

The present disclosure relates to a coil component, a circuit board, and an electronic device.

BACKGROUND

There are conventional coil components including a magnetic base body formed of a magnetic material, an external electrode provided on the surface of the magnetic base body, and a coil conductor provided in the magnetic base body and extending around a coil axis.

Coil components are, for example, inductors. Inductors are passive elements used in electronic circuits. For example, inductors eliminate noise in power source or signal lines. A conventional inductor is disclosed in Japanese Patent Application Publication No. 2018-0101732 ("the '732 Publication"). As disclosed in '732 Publication, there is a demand for more compact inductors. Here, coil components are required to have high inductance.

Metal-composite magnetic base bodies are known as the magnetic base bodies for electronic parts such as inductors. In the metal-composite magnetic base bodies, a large number of metal magnetic particles are bound together by a binder made of a resin material. The metal-composite magnetic base bodies can be made by, for example, pouring a sealing material containing a metal magnetic material and a resin into a mold having a conductor placed therein and applying pressure to the sealing material and conductor in the mold. Such metal-composite magnetic base bodies are disclosed in Japanese Patent Application Publications Nos. 2016-208002 and 2018-041955.

Containing a binder made of a resin material, the metal-composite magnetic base bodies are capable of absorbing water. Therefore, the magnetic base body contains water. When a coil component including such a metal-composite magnetic base body is mounted on a substrate using a reflow process, the magnetic base body experiences a sudden temperature rise. This causes the water contained within the magnetic base body to move to the surface of the magnetic base body and eventually evaporate into the air through the surface of the magnetic base body. When moving from within the magnetic base body to the surface, the water may follow only some of the routes within the magnetic base body. If such is the case, these routes experience a rise in pressure, which is likely to create micro cracks near these routes.

If magnetic base bodies suffer from micro cracks, the coil components may exhibit lower inductance. When water evaporates from the magnetic base bodies, the water preferably follows a plurality of diverse routes from within the magnetic base body to the surface.

SUMMARY

One object of the present invention disclosed herein is to overcome or mitigate the above drawback related to conventional coil components. One of the more specific purposes of the present invention disclosed herein is to prevent water from exclusively following only some of the routes when moving from within the magnetic base body to the surface. The other objects of the disclosure will be apparent with reference to the entire description in this specification. The present invention disclosed herein may solve any other problems grasped from the following description herein instead of or in addition to the above drawback.

One aspect of the present invention provides a coil component. The coil component includes a base body containing a plurality of metal magnetic particles and a binder binding together the metal magnetic particles, where the base body has a first surface extending along a coil axis and a second surface opposing the first surface, a first external electrode provided on the base body, a second external electrode provided on the base body, and a coil conductor electrically connected to the first and second external electrodes, where the coil conductor extends around the coil axis. In one embodiment, the coil conductor has a winding portion, the winding portion has a plurality of first conductor portions and one or more second conductor portions smaller in number than the first conductor portions, and the first and second conductor portions alternate with and are connected to each other, and a distance between the first conductor portions and the first surface is less than a distance between the second conductor portions and the second surface.

In one embodiment of the present invention, the first conductor portions are at least partially externally exposed on the first surface of the base body.

In one embodiment of the present invention, an externally exposed portion of the first conductor portions that is externally exposed on the base body is covered with an insulating film.

In one embodiment of the present invention, in the coil conductor, the number of the second conductor portions is smaller by one than the number of the first conductor portions.

In one embodiment of the present invention, the coil component is an inductor used in a DC/DC converter.

One embodiment of the present invention relates to a DC/DC converter including the above-described inductor.

One embodiment of the present invention provides a circuit board including the above-described coil component, and a mounting substrate soldered to the first and second external electrodes.

One embodiment of the present invention provides an electronic device including the above-described circuit board.

Advantageous Effects

The embodiments of the present invention disclosed herein can prevent water from exclusively following only some of the routes when moving from within the magnetic base body to the surface.

DESCRIPTION OF THE PREFERRED EMBODIMENTS

Various embodiments of the present invention will be hereinafter described with reference to the drawings. The constituents common to more than one drawing are denoted by the same reference signs throughout the drawings. It should be noted that, for convenience of explanation, the drawings are not necessarily drawn to scale.

Figure 1:
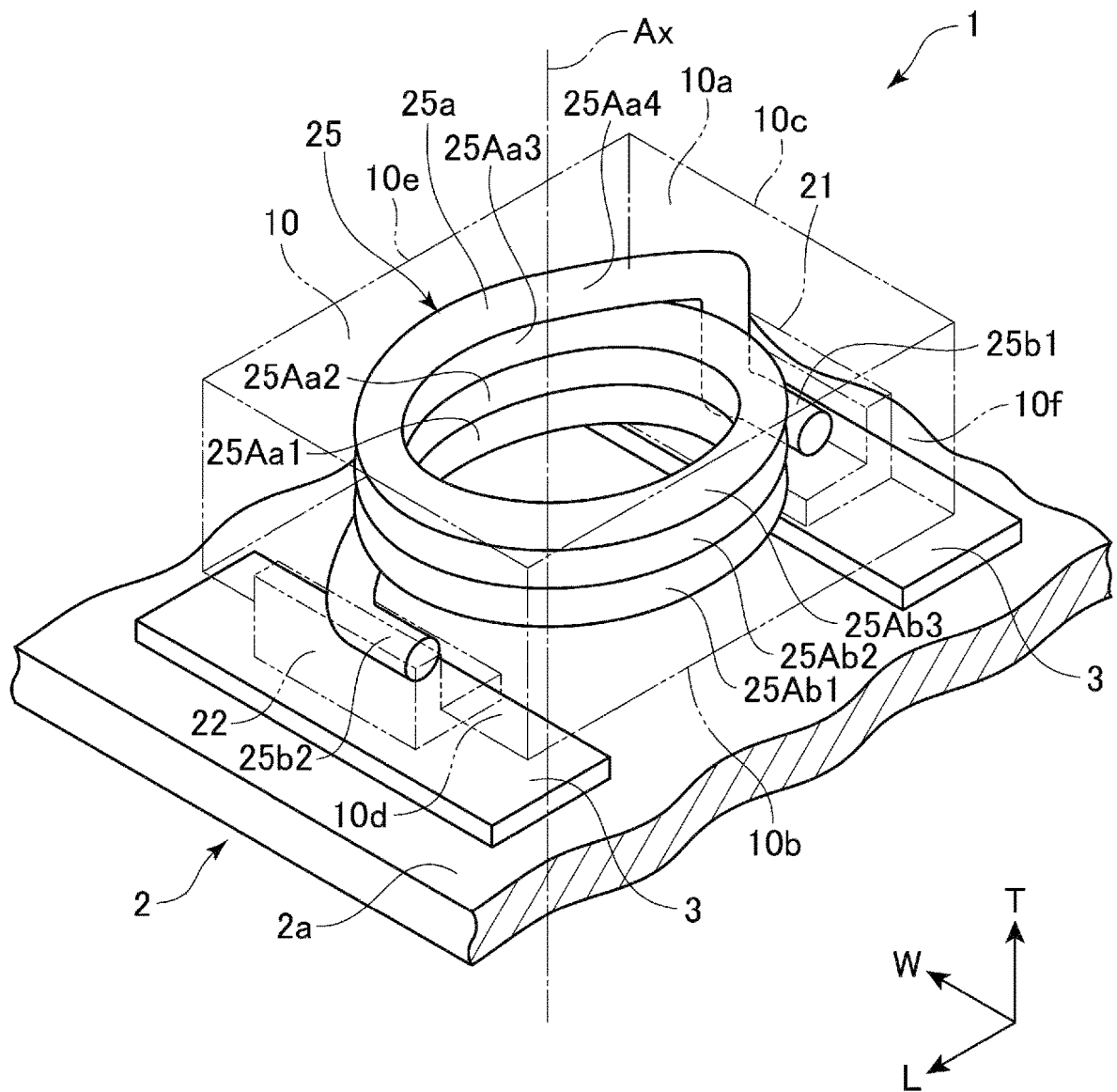
FIG. 1 is a perspective view schematically showing a coil component according to one embodiment of the present invention.
Figure 2:
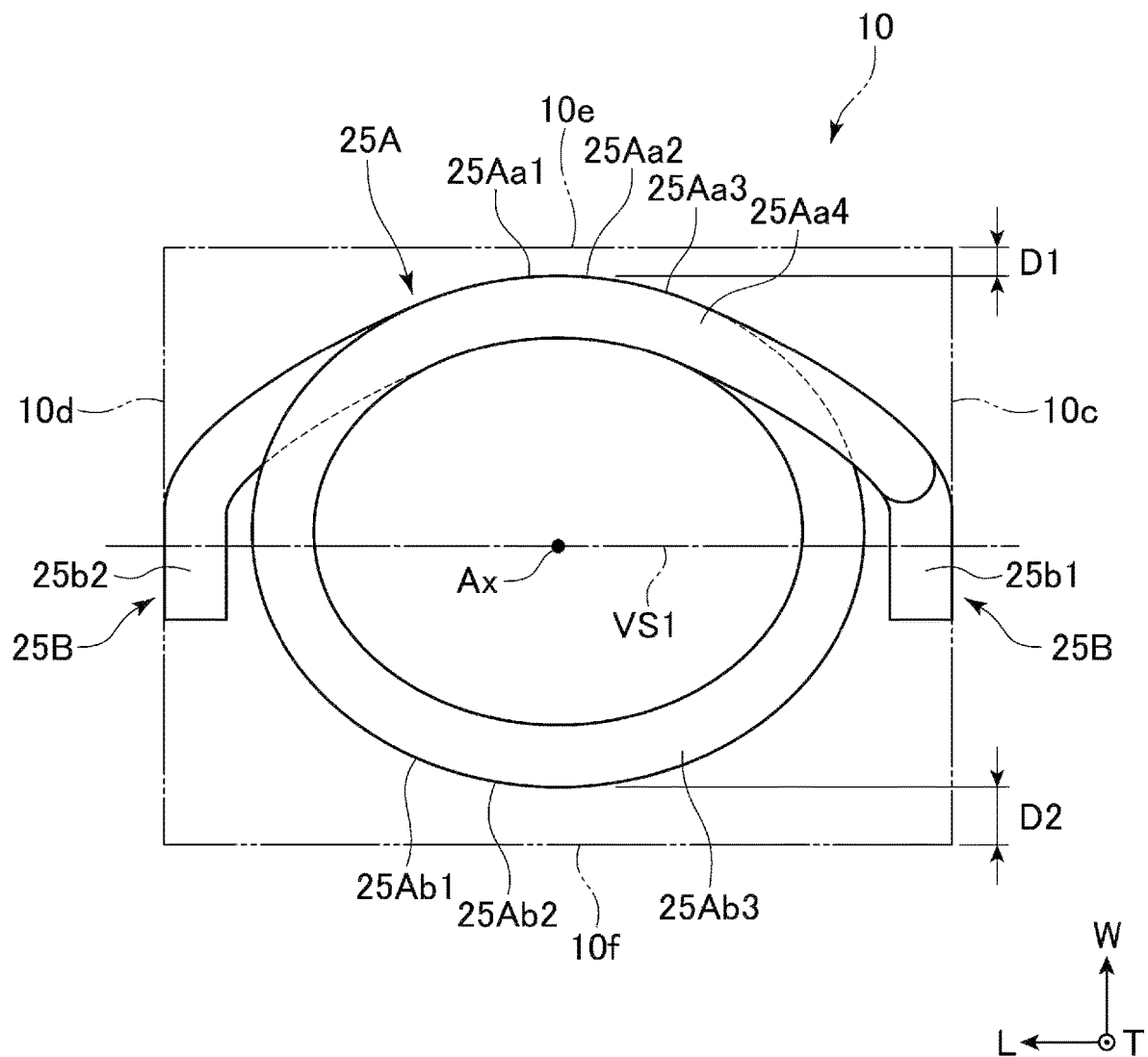
FIG. 2 is a schematic plan view of the coil component shown in FIG. 1.

A coil component 1 according to one embodiment of the present invention will be hereinafter described with reference to FIGS. 1 and 2. FIG. 1 is a schematic perspective view of the coil component 1, and FIG. 2 is a schematic plan view of the coil component 1. As shown, the coil component 1 includes a magnetic base body 10, a coil conductor 25 disposed within the magnetic base body 10, an external electrode 21 disposed on the surface of the magnetic base body 10, and an external electrode 22 disposed on the surface of the magnetic base body 10 at a position spaced apart from the external electrode 21.

In this specification, a "length" direction, a "width" direction, and a "thickness" direction of the coil component 1 are referred to as an "L axis" direction, a "W axis" direction, and a "T axis" direction in FIG. 1, respectively, unless otherwise construed from the context. The "thickness" direction is also referred to as the "height" direction.

The coil component 1 is mounted on a mounting substrate 2a. A circuit board 2 includes the coil component 1 and the mounting substrate 2a having the coil component 1 mounted thereon. The mounting substrate 2a has two land portions 3 provided thereon. The coil component 1 is mounted on the mounting substrate 2a by bonding the external electrodes 21, 22 to the corresponding land portions 3 of the mounting substrate 2a. The circuit board 2 can be installed in various electronic devices. The electronic devices in which the circuit board 2 may be installed include smartphones, tablets, game consoles, electrical components of automobiles, and various other electronic devices.

The coil component 1 may be applied to inductors, transformers, filters, reactors, and various other coil components. The coil component 1 may also be applied to coupled inductors, choke coils, and various other magnetically coupled coil components. The coil component 1 may be, for example, an inductor used in a DC/DC converter. Applications of the coil component 1 are not limited to those explicitly described herein.

The magnetic base body 10 is made of a magnetic material and formed in a rectangular parallelepiped shape as a whole. In one embodiment of the invention, the magnetic base body 10 has a length (the dimension in the L axis direction) of 1.6 to 4.5 mm, a width (the dimension in the W axis direction) of 0.8 to 3.2 mm, and a height (the dimension in the T axis direction) of 0.8 to 5.0 mm. The dimensions of the magnetic base body 10 are not limited to those specified herein. The term "rectangular parallelepiped" or "rectangular parallelepiped shape" used herein is not intended to mean solely "rectangular parallelepiped" in a mathematically strict sense.

The magnetic base body 10 has a first principal surface 10a, a second principal surface 10b, a first end surface 10c, a second end surface 10d, a first side surface 10e, and a second side surface 10f. The outer surface of the magnetic base body 10 is defined by these six surfaces. The first principal surface 10a and the second principal surface 10b are surfaces at the opposite ends in the height direction, the first end surface 10c and the second end surface 10d are surfaces at the opposite ends in the length direction, and the first side surface 10e and the second side surface 10f are surfaces at the opposite ends in the width direction.

As shown in FIG. 1, the first principal surface 10a lies on the top side of the magnetic base body 10, and therefore, the first principal surface 10a may be herein referred to as "the top surface." Similarly, the second principal surface 10b may be referred to as "the bottom surface." The coil component 1 is disposed such that the second principal surface 10b faces the mounting substrate 2a, and therefore, the second principal surface 10b may be herein referred to as "the mounting surface." The top-bottom direction of the coil component 1 refers to the top-bottom direction in FIG. 1.

In one embodiment of the present invention, the external electrode 21 extends on the mounting surface 10b and the end surface 10c of the magnetic base body 10. The external electrode 22 extends on the mounting surface 10b and the end surface 10d of the magnetic base body 10. The shapes and positioning of the external electrodes 21, 22 are not limited to those in the example shown. The external electrodes 21 and 22 are separated from each other in the length direction.

In one embodiment, the magnetic base body 10 is made of a composite magnetic material containing a plurality of types of metal magnetic particles and a binder. The metal magnetic particles may be a particle mixture obtained by mixing together a plurality of types of metal magnetic particles having different average particle sizes. When the metal magnetic particles contain large-diameter metal magnetic particles and small-diameter metal magnetic particles, the large-diameter metal magnetic particles have an average particle size of, for example, 10 μm, and the small-diameter metal magnetic particles have an average particle size of, for example, 1 μm. The binder binds together the plurality of types of metal magnetic particles.

The metal magnetic particles are made of various soft magnetic materials. For example, a main ingredient of the metal magnetic particles is Fe. Specifically, the metal magnetic particles are particles of (1) a metal such as Fe or Ni, (2) a crystalline alloy such as an Fe—Si—Cr alloy, an Fe—Si—Al alloy, or an Fe—Ni alloy, (3) an amorphous alloy such as an Fe—Si—Cr—B—C alloy or an Fe—Si—Cr—B alloy, or (4) a mixture thereof. The composition of the metal magnetic particles contained in the magnetic base body 10 is not limited to those described above. The metal magnetic particles may have, on their respective surfaces, an insulting film formed of, for example, a glass, a resin, or other highly insulating materials.

The binder is, for example, a highly insulating thermosetting resin. The binder is made of a resin material having lower permeability than the metal magnetic particles. Examples of the resin material of the binder include an epoxy resin, a polyimide resin, a polystyrene (PS) resin, a high-density polyethylene (HDPE) resin, a polyoxymethylene (POM) resin, a polycarbonate (PC) resin, a polyvinylidene fluoride (PVDF) resin, a phenolic resin, a polytetrafluoroethylene (PTFE) resin, or a polybenzoxazole (PBO) resin.

The coil conductor 25 includes a winding portion 25A and lead-out conductors 25B. The winding portion 25A is wound spirally around a coil axis Ax extending along the thickness direction (the T direction), and the lead-out conductors 25B are led out from the opposite ends of the winding portion 25A to connect the opposite ends to the external electrodes 21, 22, respectively. The lead-out conductors 25B include a first lead-out conductor 25b1 connecting one of the ends of the winding portion 25A and the external electrode 21 and a second lead-out conductor 25b2 connecting the other end of the winding portion 25A and the external electrode 22. In the illustrated embodiment, the coil axis Ax intersects the first and second principal surfaces 10a and 10b, but does not intersect the first and second end surfaces 10c and 10d and the first and second side surfaces 10e and 10f. In other words, the first and second end surfaces 10c and 10d and the first and second side surfaces 10e and 10f extend along the coil axis Ax.

In the winding portion 25A, a plurality of first conductor portions and one or more second conductor portions smaller in number than the first conductor portions alternate with and are connected to each other. In the illustrated embodiment, the winding portion 25A includes four first conductor portions 25Aa1 to 25Aa4 and three second conductor portions 25Ab1 to 25Ab3. The first conductor portions 25Aa1 to 25Aa4 are example first conductor portions included in the winding portion 25A, and the second conductor portions 25Ab1 to 25Ab3 are example second conductor portions included in the winding portion 25A. The number of first conductor portions included in the winding portion 25A is not limited to four. In one embodiment, the number of first conductor portions included in the winding portion 25A ranges from two to five. In one embodiment, the number of second conductor portions included in the winding portion 25A is smaller by one than the number of first conductor portions. The number of second conductor portions included in the winding portion 25A ranges from one to four, for example.

More specifically, the winding portion 25A includes: the first conductor portion 25Aa1 connected to the second lead-out conductor 25b2 and extending from its connection with the second lead-out conductor 25b2 clockwise around the coil axis Ax; the second conductor portion 25Ab1 extending clockwise around the coil axis Ax from the end of the first conductor portion 25Aa1 opposite to its end connected to the second lead-out conductor 25b2; the first conductor portion 25Aa2 extending clockwise around the coil axis Ax from the end of the second conductor portion 25Ab1 opposite to its end connected to the first conductor portion 25Aa1; the second conductor portion 25Ab2 extending clockwise around the coil axis Ax from the end of the first conductor portion 25Aa2 opposite to its end connected to the second conductor portion 25Ab1; the first conductor portion 25Aa3 extending clockwise around the coil axis Ax from the end of the second conductor portion 25Ab2 opposite to its end connected to the first conductor portion 25Aa2; the second conductor portion 25Ab3 extending clockwise around the coil axis Ax from the end of the first conductor portion 25Aa3 opposite to its end connected to the second conductor portion 25Ab2; and the first conductor portion 25Aa4 extending clockwise around the coil axis Ax to its connection with the first lead-out conductor 25b1, from the end of the second conductor portion 25Ab3 opposite to its end connected to the first conductor portion 25Aa3. As described above, in the winding portion 25A, the first conductor portions 25Aa1 to 25Aa4 and the second conductor portions 25Ab1 to 25Ab3 alternate with and are connected to each other. The first conductor portions 25Aa1 to 25Aa4 extend, as a whole, along the first side surface 10e, and the second conductor portions 25Ab1 to 25Ab3 extend, as a whole, along the second side surface 10f. If it is required to draw a boundary between the first conductor portions 25Aa1 to 25Aa4 and the second conductor portions 25Ab1 to 25Ab3, an imaginary plane VS1 passing through the coil axis Ax and parallel to the LT plane can be used as the boundary plane lying between the first conductor portions 25Aa1 to 25Aa4 and the second conductor portions 25Ab1 to 25Ab3.

The following describes how the coil conductor 25 is arranged relative to the magnetic base body 10 with reference to FIG. 2. FIG. 2 is a schematic plan view of the coil component 1 as viewed in the direction of the coil axis Ax. FIG. 2 shows the magnetic base body 10 and a transmission image of the coil conductor 25 as viewed in the direction of the coil axis Ax. In FIG. 2, the external electrodes 21, 22 are not shown for convenience of description. As described above, the ends of the generally ellipsoidal winding portion 25A are connected to the lead-out conductors 25B, and, in the winding portion 25A, the four first conductor portions 25Aa1 to 25Aa4 and the three second conductor portions 25Ab1 to 25Ab3 alternate with and are connected to each other. The coil conductor 25 is designed and arranged such that a distance D1 between the first conductor portions and the first side surface 10e is less than a distance D2 between the second conductor portions and the second side surface 10f.

In one embodiment, the ratio of D1 to D2, or D1/D2 is set lower than 1. This can assure the ease of the movement of the water, in the region with more conductor portions, namely, the first conductor portions, from within the magnetic base body 10 to the surface. In other words, between the surface of the magnetic base body 10 and the first conductor portions, the resistance against the movement of the water is high due to the larger number of conductor portions but mitigated by reducing the distance between the surface of the magnetic base body 10 and the first conductor portions.

In one embodiment, the ratio D1/D2 may decrease as the number of the first conductor portions decreases. For example, the number of the conductors included in the first conductor portions may be inversely proportional or substantially inversely proportional to the ratio D1/D2. More specifically, the ratio D1/D2 can range from 0.5 to 1 (0.5<D1/D2<1), which depends on the number of the first conductor portions. In the illustrated embodiment, since the numbers of the first and second conductor portions are respectively four and three, the ratio D1/D2 can range from 0.75 to 1 (0.75<D1/D2<1). When the numbers of the first and second conductor portions are respectively two and one, the ratio D1/D2 can range from 0.5 to 1 (0.5<D1/D2<1). When the numbers of the first and second conductor portions are respectively three and two, the ratio D1/D2 can range from to 1 (0.67<D1/D2<1). When the numbers of the first and second conductor portions are respectively five and four, the ratio D1/D2 can range from 0.8 to 1 (0.8 D1/D2<1). If the value of D1/D2 falls within any one of the abovementioned ranges determined by the numbers of the first and second conductor portions, the water is encouraged to move from within the magnetic base body 10 to the first side surface 10. This can achieve uniform easiness for the movement of the water from within the magnetic base body 10 to the surface. When the magnetic base body 10 is mounted using a reflow process or the like, the magnetic base body 10 is exposed to heat, which expands the volume of the water remaining in the magnetic base body 10. The volume expansion applies stress to the magnetic base body 10. Allowing the water to move more easily from within the magnetic base body 10 to the surface can result in relieving the stress on the magnetic base body 10. As a result, micro cracks can be controlled from appearing in the magnetic base body 10. In addition, since the ratio D1/D2 is set higher than 0.8 and lower than 1, the inductance or magnetic saturation characteristics can be preserved. For example, when the ratio D1/D2 is the rate of change in inductance can be −5% or lower, when compared with the case where the ratio D1/D2 is 1. Since the ratio D1/D2 is set lower than 1 as described above, the inductance or magnetic saturation characteristics may decline but the rate of the decline is reduced while, at the same time, the micro cracks are controlled from appearing in the magnetic base body 10 to preserve the reliability. This is critical particularly for applications requiring high reliability such as automobiles.

If each of the first conductor portions 25Aa1 to 25Aa4 is at the same distance from the first side surface 10e, the distance D1 between the first conductor portions and the first side surface 10e can be defined as the distance between any one of the first conductor portions 25Aa1 to 25Aa4 and the first side surface 10e. If the first conductor portions 25Aa1 to 25Aa4 are at different distances from the first side surface 10e, the distance D1 between the first conductor portions and the first side surface 10e can be defined as the shortest one of the distances between the first conductor portions 25Aa1 to 25Aa4 and the first side surface 10e, or as an average among the distances between the first conductor portions 25Aa1 to 25Aa4 and the first side surface 10e. The distance between each of the first conductor portions to 25Aa4 and the first side surface 10e may denote the shortest distance therebetween. The distance D2 between the second conductor portions and the second side surface 10f can be defined in the same manner as the distance D1. In other words, if each of the second conductor portions 25Ab1 to 25Ab3 is at the same distance from the second side surface 10f, the distance D2 between the second conductor portions and the second side surface 10f can be defined as the distance between any one of the second conductor portions 25Ab1 to 25Ab3 and the second side surface 10f. If the second conductor portions 25Ab1 to 25Ab3 are at different distances from the second side surface 10f, the distance D2 between the second conductor portions and the second side surface 10f can be defined as the shortest one of the distances between the second conductor portions 25Ab1 to 25Ab3 and the second side surface 10f, or as an average among the distances between the second conductor portions 25Ab1 to 25Ab3 and the second side surface 10f. The distance between each of the second conductor portions 25Ab1 to 25Ab3 and the second side surface 10f may denote the shortest distance therebetween.

When seen from above, the winding portion 25A may be shaped like an ellipsoid, an ellipse, a circle, a rectangle, a polygon other than a rectangle and various other shapes.

Figure 8:
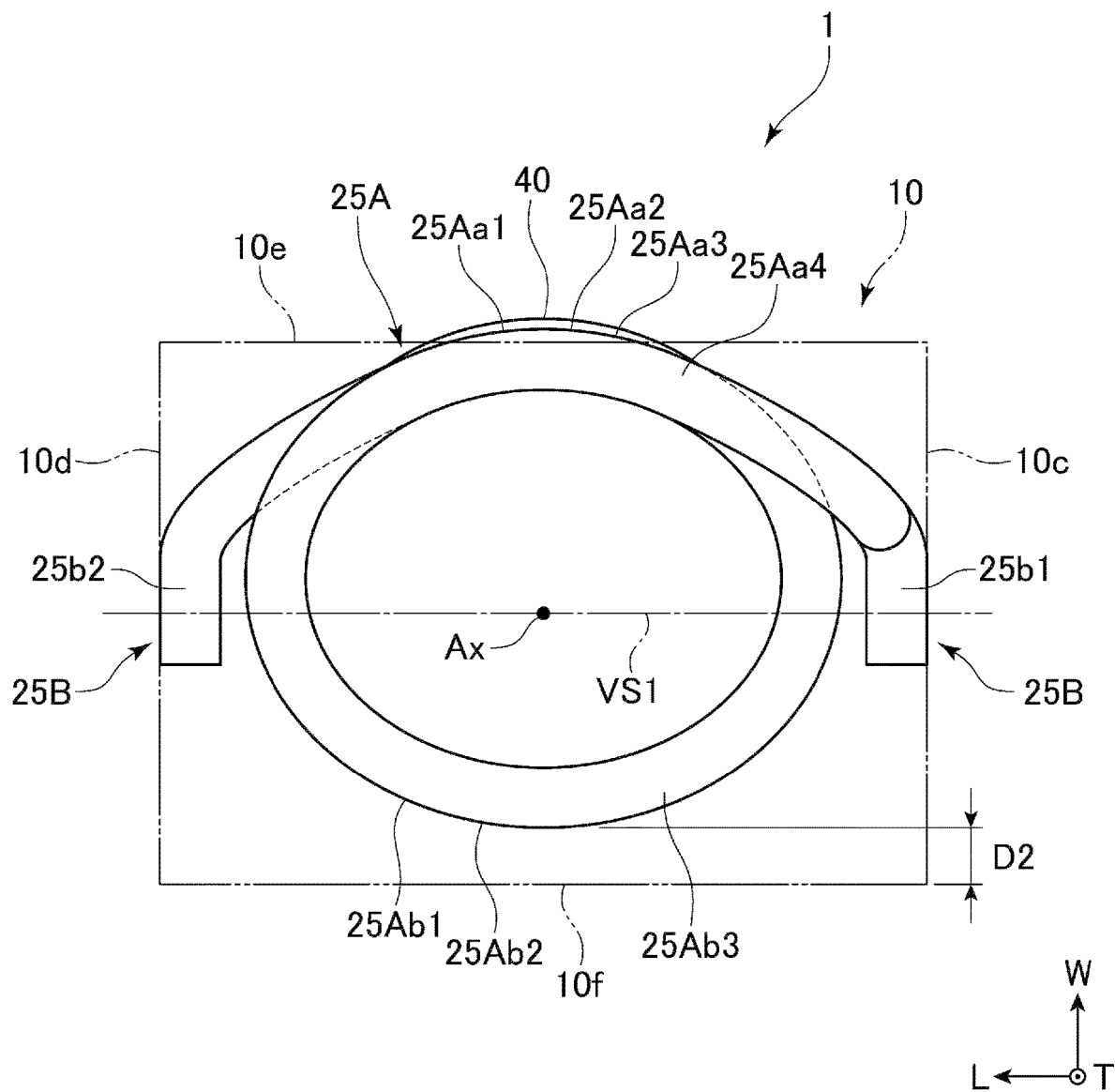
FIG. 8 is a plan view schematically showing a coil component according to another embodiment of the present invention.

FIG. 8 shows a modification example of the coil component 1. FIG. 8 is a plan view showing the coil component 1 relating to another embodiment of the invention. In the coil component 1 illustrated in FIG. 8, the first conductor portions 25Aa1 to 25Aa4 of the winding portion 25A of the coil conductor 25 are externally exposed on the first side surface 10e of the magnetic base body 10. As shown in FIG. 8, the first conductor portions 25Aa1 to 25Aa4 may be at least partially externally exposed on the first side surface 10e of the magnetic base body 10. If the first conductor portions 25Aa1 to 25Aa4 are at least partially externally exposed on the first side surface 10e of the magnetic base body 10, the distance D1 between the first conductor portions of the coil conductor and the first side surface 10e may be considered to be zero. The externally exposed portion of the first conductor portions to 25Aa4 that is externally exposed on the magnetic base body 10 may be covered with an insulating film 40 in order to avoid undesirable electrical connection. The insulating film 40 is formed of a resin, glass or any other highly insulating material.

An example method of manufacturing the coil component 1 according to one embodiment of the invention will now be described. The following describes an example method of manufacturing the coil component 1 using a compression molding process. To begin with, the metal magnetic particles are prepared. An insulating film is formed on the surface of the metal magnetic particles, as required. As described above, the metal magnetic particles may be a mixture of particles obtained by mixing together a plurality of types of particles having different average particle sizes. Following this, the prepared metal magnetic particles, a resin material, and a diluting solvent are mixed together, making a composite magnetic material. Next, the composite magnetic material is placed in a prepared mold having the coil conductor 25 installed therein, which is then exposed to molding pressure applied at a warm temperature of, for example, 50° C. to 150° C., and further heated to 150° C. to 400° C. for curing. In this way, the magnetic base body 10 having the coil conductor 25 therein is obtained. The coil conductor 25 is arranged in the mold such that, when seen in the direction of the coil axis Ax, the distance D1 between the first conductor portions of the coil conductor 25 and the first side surface 10e of the magnetic base body 10 is less than the distance D2 between the second conductor portions of the coil conductor 25 and the second side surface 10f.

The heating performed to make the magnetic base body 10 may be performed in two steps as described above, or in a single step. When the heating is performed in a single step, molding and curing are performed during the heating. In the magnetic base body 10, the resin contained in the composite magnetic material is cured and serves as the binder 33. The magnetic base body 10 may be molded at a warm temperature of around 80° C., for example. The molding pressure is, for example, 50 MPa to 200 MPa. The molding pressure can be appropriately adjusted to obtain a desired filling factor. The molding pressure is, for example, 100 MPa.

Next, a conductor paste is applied to the surface of the magnetic base body 10, which is obtained in the above-described manner, to form the external electrodes 21 and 22. The external electrode 21 is electrically connected to one end of the coil conductor 25 placed within the magnetic base body 10, and the external electrode 22 is electrically connected to the other end of the coil conductor 25 placed within the magnetic base body 10. The coil component 1 is obtained in the above-described manner.

The manufactured coil component 1 is mounted on the mounting substrate 2a using a reflow process. In this process, the mounting substrate 2a having the coil component 1 thereon passes at a high speed through a reflow furnace heated to, for example, a peak temperature of 260° C., and then the external electrodes 21, 22 are soldered to the corresponding land portions 3 of the mounting substrate 2a. In this way, the coil component 1 is mounted on the mounting substrate 2a, and thus the circuit board 2 is manufactured.

Figure 3:
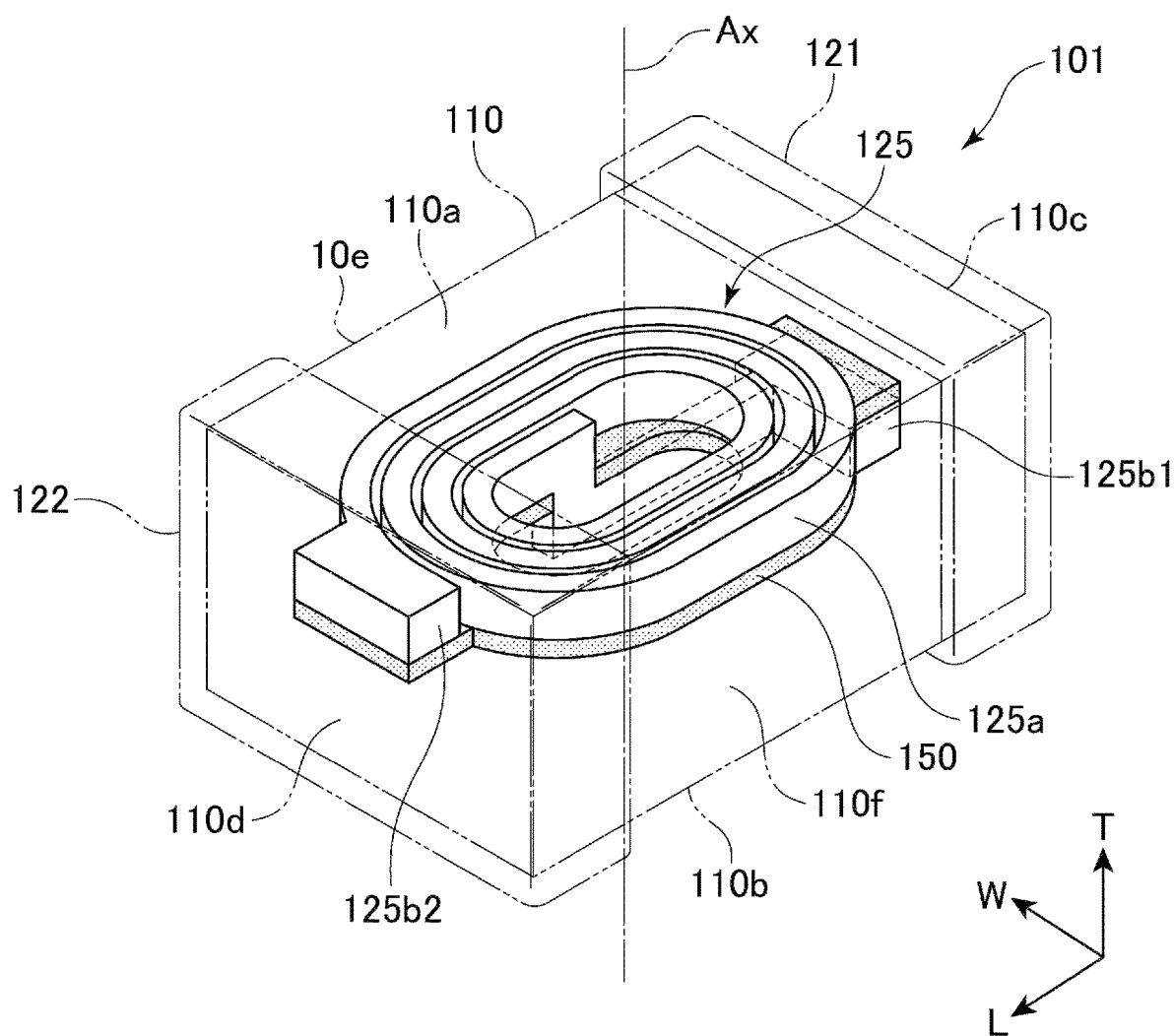
FIG. 3 is a perspective view schematically showing a coil component according to another embodiment of the present invention.

Next, a coil component 101 relating to another embodiment of the present invention will be described with reference to FIGS. 3 and 4. The coil component 101 is a planar coil. As shown, the coil component 101 includes a magnetic base body 110, an insulating plate 150 provided in the magnetic base body 110, a coil conductor 125 provided on top and bottom surfaces of the insulating plate 150 in the magnetic base body 110, an external electrode 121 provided on the magnetic base body 110, and an external electrode 122 provided on the magnetic base body 110 at a position spaced apart from the external electrode 121. The magnetic base body 110 is made of a magnetic material, similarly to the magnetic base body 10. The insulating plate 150 is made of an insulating material and has a shape like a plate.

The magnetic base body 110 is formed in a rectangular parallelepiped shape as a whole. The magnetic base body 110 has a first principal surface 110a, a second principal surface 110b, a first end surface 110c, a second end surface 110d, a first side surface 110e, and a second side surface 110f. The outer surface of the magnetic base body 110 is defined by these six surfaces. The first principal surface 110a and the second principal surface 110b are at the opposite ends in the height direction, the first end surface 110c and the second end surface 110d are at the opposite ends in the length direction, and the first side surface 110e and the second side surface 110f are at the opposite ends in the width direction. The above explanation of the magnetic base body 10 also applies to the magnetic base body 110 to a maximum extent.

The coil conductor 125 includes a winding portion 125A and lead-out conductors 125B. The winding portion 125A is wound spirally around the coil axis Ax extending along the thickness direction (the T direction), and the lead-out conductors 125B are led out from opposite ends of the winding portion 125A to connect the opposite ends to the external electrodes 121, 122, respectively. The lead-out conductors 125B include a first lead-out conductor 125b1 connecting one of the ends of the winding portion 125A and the external electrode 121 and a second lead-out conductor 125b2 connecting the other end of the winding portion 125A and the external electrode 122.

Similarly to the winding portion 25A, the winding portion 125A includes a plurality of first conductor portions and one or more second conductor portions smaller in number than the first conductor portions. The description on the coil conductor 25 also applies to the coil conductor 125 to a maximum extent. In the illustrated embodiment, the winding portion 125A includes four first conductor portions 125Aa1 to 125Aa4 and three second conductor portions 125Ab1 to 125Ab3. The first conductor portions 125Aa1 to 125Aa4 are example first conductor portions included in the winding portion 125A, and the second conductor portions 125Ab1 to 125Ab3 are example second conductor portions included in the winding portion 125A. In one embodiment, the number of first conductor portions included in the winding portion 125A ranges from two to five. In one embodiment, the number of second conductor portions included in the winding portion 125A is smaller by one than the number of first conductor portions. The number of second conductor portions included in the winding portion 125A ranges from one to four, for example.

More specifically, the winding portion 125A includes: the first conductor portion 125Aa1 connected to the second lead-out conductor 125b2 and extending from its connection with the second lead-out conductor 125b2 clockwise around the coil axis Ax; the second conductor portion 125Ab1 extending clockwise around the coil axis Ax from the end of the first conductor portion 125Aa1 opposite to its end connected to the second lead-out conductor 125b2; the first conductor portion 125Aa2 extending clockwise around the coil axis Ax from the end of the second conductor portion 125Ab1 opposite to its end connected to the first conductor portion 125Aa1; the second conductor portion 125Ab2 extending clockwise around the coil axis Ax from the end of the first conductor portion 125Aa2 opposite to its end connected to the second conductor portion 125Ab1; the first conductor portion 125Aa3 extending clockwise around the coil axis Ax from the end of the second conductor portion 125Ab2 opposite to its end connected to the first conductor portion 125Aa2; the second conductor portion 125Ab3 extending clockwise around the coil axis Ax from the end of the first conductor portion 125Aa3 opposite to its end connected to the second conductor portion 125Ab2; and the first conductor portion 125Aa4 extending clockwise around the coil axis Ax to its connection with the first lead-out conductor 125b1, from the end of the second conductor portion 125Ab3 opposite to its end connected to the first conductor portion 125Aa3. The first conductor portion 125Aa4 penetrates the insulating plate 150 along the T-axis direction and then extends along the back surface of the insulating plate 150 (the negative-side surface in the T-axis direction) to the first lead-out conductor 125b1. As described above, in the winding portion 125A, the first conductor portions 125Aa1 to 125Aa4 and the second conductor portions 125Ab1 to 125Ab3 alternate with and are connected to each other. The first conductor portions 125Aa1 to 125Aa4 extend, as a whole, along the first side surface 110e, and the second conductor portions 125Ab1 to 125Ab3 extend, as a whole, along the second side surface 110f. If it is required to draw a boundary between the first conductor portions 125Aa1 to 125Aa4 and the second conductor portions 125Ab1 to 125Ab3, an imaginary plane VS1 passing through the coil axis Ax and parallel to the LT plane can be used as the boundary plane lying between the first conductor portions 125Aa1 to 125Aa4 and the second conductor portions 125Ab1 to 125Ab3.

Figure 4:
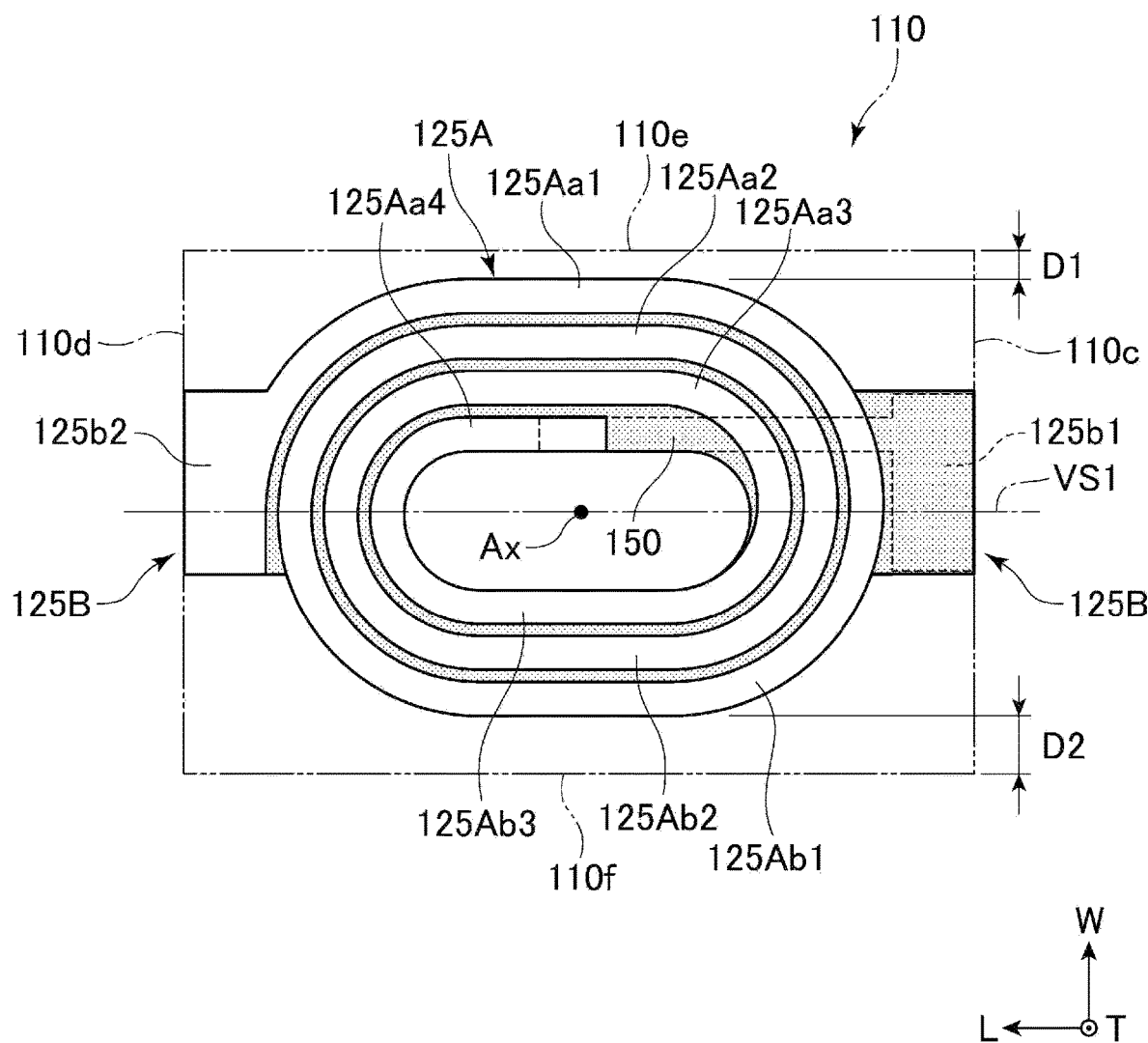
FIG. 4 is a schematic plan view of the coil component shown in FIG. 3.

The following describes how the coil conductor 125 is arranged relative to the magnetic base body 110 with reference to FIG. 4. FIG. 4 is a schematic plan view of the coil component 101 as viewed in the direction of the coil axis Ax. FIG. 4 shows the magnetic base body 110 and a transmission image of the coil conductor 125 as viewed in the direction of the coil axis Ax. In FIG. 4, the external electrodes 121, 122 are not shown for convenience of description. As described above, the ends of the generally ellipsoidal winding portion 125A are connected to the lead-out conductors 125B, and, in the winding portion 125A, the four first conductor portions 125Aa1 to 125Aa4 and the three second conductor portions 125Ab1 to 125Ab3 alternate with and are connected to each other. The coil conductor 125 is designed and arranged such that a distance D1 between the first conductor portions and the first side surface 110e is less than a distance D2 between the second conductor portions and the second side surface 110f. The first conductor portion 125Aa1 of the coil conductor 125 may be at least partially externally exposed on the first side surface 110e of the magnetic base body 110. The portion of the first conductor portion 125Aa1 that is externally exposed on the magnetic base body 110 may be covered with a magnetic layer. This magnetic layer may be made in the same manner as the magnetic layer 40.

Next, a description is given of an example manufacturing method of the coil component 101. To start with, an insulating plate 150 made of a magnetic material and shaped like a plate is prepared. Next, a photoresist is applied to the top surface and the bottom surface of the insulating plate 150, and then conductor patterns are transferred onto the top surface and the bottom surface of the insulating plate 150 by exposure, and development is performed. As a result, a resist having an opening pattern for forming the coil conductor 125 is formed on each of the top surface and the bottom surface of the insulating plate 150.

Next, plating is performed, so that each of the opening patterns is filled with a conductive metal. Next, etching is performed to remove the resists from the insulating plate 150, so that the coil conductor 125 is formed on the top surface and the bottom surface of the insulating plate 150. A through-hole formed in the insulating plate 150 is filled with a conductive metal to form a via connecting the portions of the coil conductor 125 that are respectively on the front and back surfaces of the insulating plate 150.

The magnetic base body 110 is subsequently formed on both surfaces of the insulating plate 150 where the coil conductor 125 has been formed. To form the magnetic base body 110, magnetic sheets are first made. In order to make the magnetic sheets, metal magnetic particles are first prepared. An insulating film is formed on the surface of the metal magnetic particles, as required. As described above, the metal magnetic particles may be a mixture of particles obtained by mixing together a plurality of types of particles having different average particle sizes. Following this, the prepared metal magnetic particles, a resin material, and a diluting solvent are mixed and kneaded together, making a slurry. The slurry contains the metal magnetic particles dispersed therein. Subsequently, the slurry is applied in the form of a sheet onto a base material such as a PET film, and the applied slurry is dried to volatilize the diluting solvent. This in turn makes a magnetic sheet made of the resin and having the metal magnetic particles dispersed therein. Two such magnetic sheets are provided, between which the above-described coil conductor is placed, and pressure is then applied to them while they are heated. In this way, a laminated body is made. The method of making the laminated body is not limited to the same. According to another method of making the laminated body, the insulating plate 150 having the coil conductor 125 formed thereon is placed in a mold, into which the slurry obtained by mixing together the metal magnetic particles and resin material is poured. Pressure is then applied to the mold while it is being heated, thereby making the laminated body. The laminated body may be molded at a warm temperature of 50° C. to 150° C., for example, around 80° C. The molding pressure is, for example, 50 MPa to 200 MPa. The molding pressure can be appropriately adjusted to obtain a desired filling factor. The molding pressure is, for example, 100 MPa. Next, the laminated body is subjected to heat treatment at the curing temperature of the resin, for example, at a temperature of 150° C. to 400° C. In this way, the magnetic base body 110 containing the coil conductor 125 therein can be obtained. The external electrodes 121, 122 are provided on the external surface of the magnetic base body 110 at predetermined positions. In this manner, the coil component 101 is made.

Figure 5:
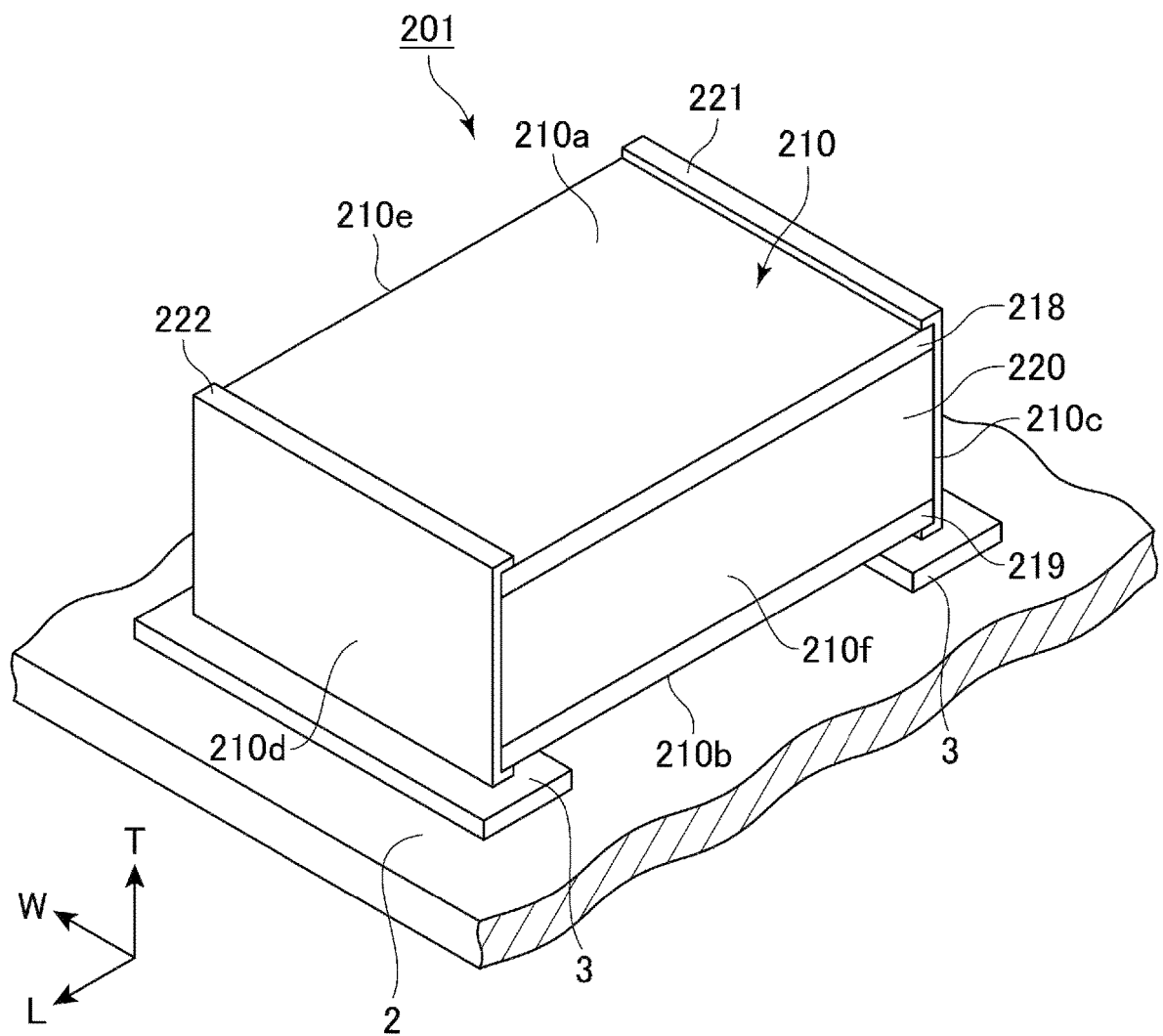
FIG. 5 is a perspective view schematically showing a coil component according to another embodiment of the present invention.
Figure 6:
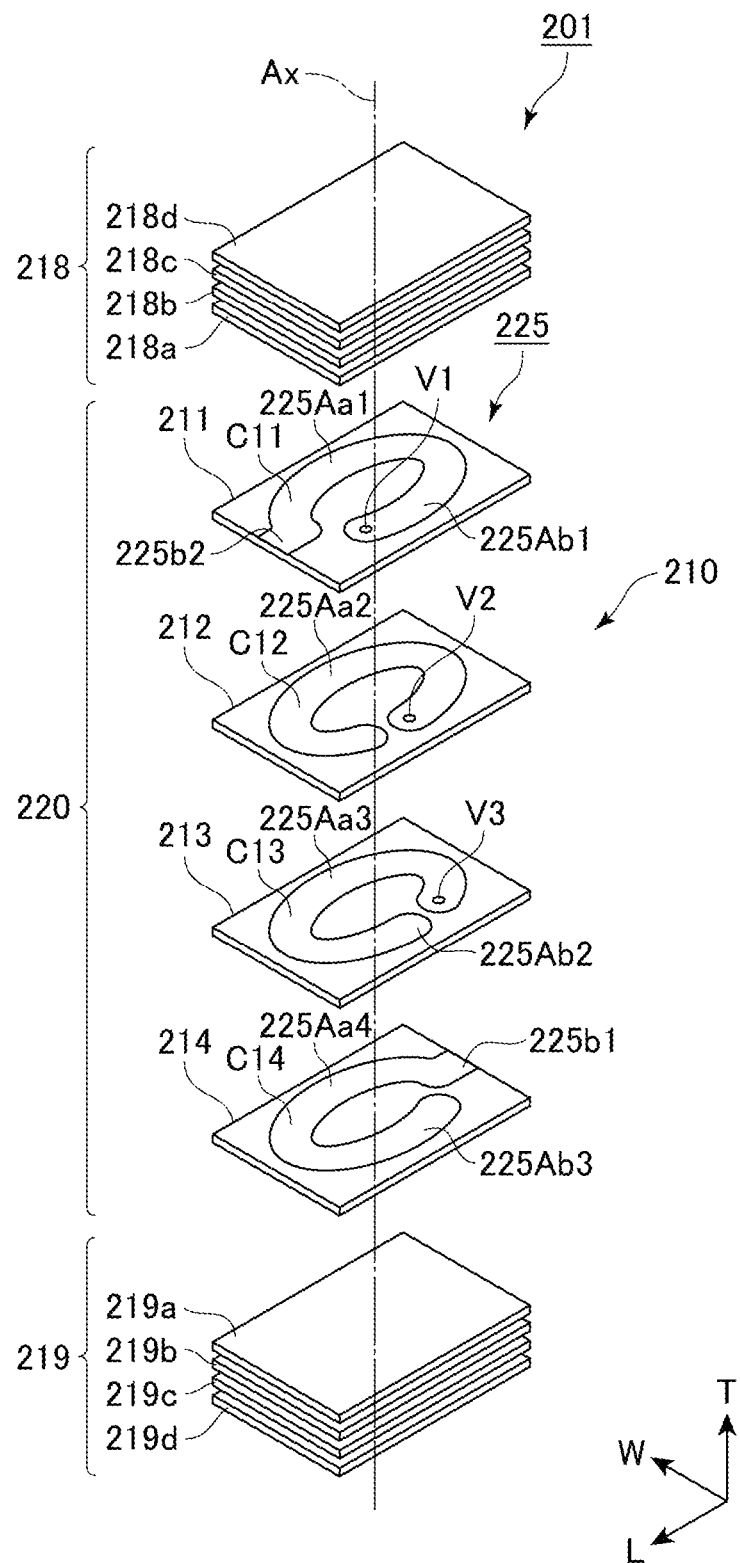
FIG. 6 is an exploded perspective view schematically showing the coil component shown in FIG. 5.
Figure 7:
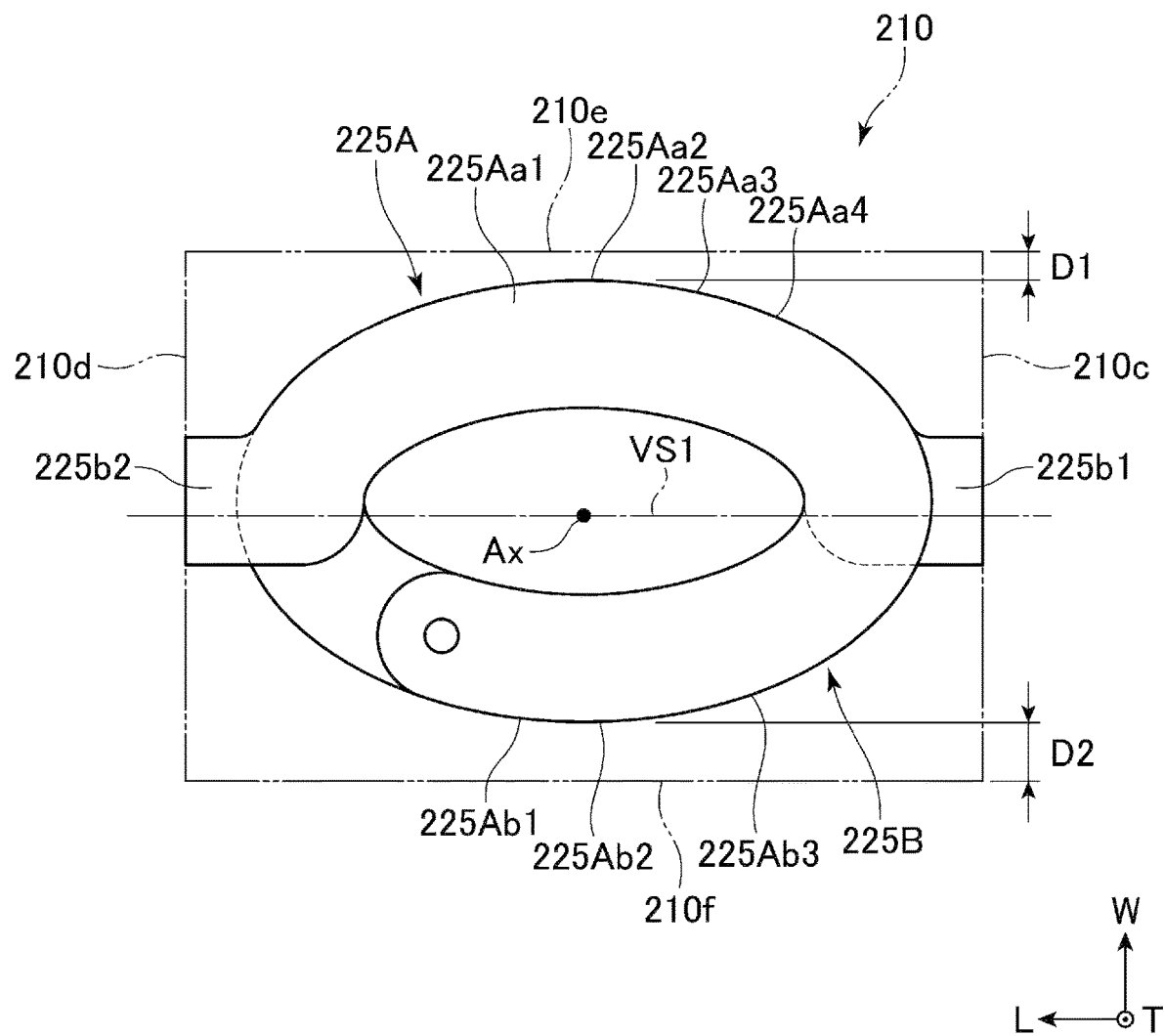
FIG. 7 is a schematic plan view of the coil component shown in FIG. 5.

The following describes a coil component 201 relating to another embodiment of the present invention with reference to FIGS. 5 to 7. The coil component 201 is a laminated coil. As shown, the coil component 201 includes a magnetic base body 210, a coil conductor 225 disposed in the magnetic base body 210, an external electrode 221 disposed on the magnetic base body 210, and an external electrode 222 disposed on the magnetic base body 210 at a position spaced apart from the external electrode 221. The magnetic base body 210 has a pair of external electrodes disposed thereon. The magnetic base body 210 is made of a magnetic material, similarly to the magnetic base body 10.

The magnetic base body 210 is made of a magnetic material and formed in a rectangular parallelepiped shape. The magnetic base body 210 includes a magnetic layer 220 having the coil conductor 225 embedded therein, a top cover layer 218 formed on the top surface of the magnetic layer 220 and made of a magnetic material, and a bottom cover layer 219 formed on the bottom surface of the magnetic layer 220 and made of a magnetic material. The top cover layer 218 includes magnetic films 218a to 218d made of a magnetic material, and the bottom cover layer 219 includes magnetic films 219a to 219d made of a magnetic material. The boundary between the magnetic layer 220 and the top cover layer 218 and the boundary between the magnetic layer 220 and the bottom cover layer 219 may not be clearly identified depending on the manufacturing method used to make the magnetic base body 210. The magnetic base body 210 is generally shaped as a rectangular parallelepiped and has a first principal surface 210a, a second principal surface 210b, a first end surface 210c, a second end surface 210d, a first side surface 210e, and a second side surface 210f. The outer surface of the magnetic base body 210 is defined by these six surfaces. The first principal surface 210a and the second principal surface 210b are at the opposite ends in the height direction, the first end surface 210c and the second end surface 210d are at the opposite ends in the length direction, and the first side surface 210e and the second side surface 210f are at the opposite ends in the width direction. The above explanation of the magnetic base body 10 also applies to the magnetic base body 210 to a maximum extent.

The magnetic layer 220 includes magnetic films 211 to 214. In the magnetic layer 220, the magnetic films 211, 212, 213 and 214 are stacked in the stated order from the positive side to the negative side in the T-axis direction. On the respective top surfaces of the magnetic films 211 to 214, conductor patterns C11 to C14 are formed. The conductor patterns C11 to C14 are formed by, for example, printing a conductive paste made of a highly conductive metal or alloy via screen printing. The conductive paste may be made of Ag, Pd, Cu, Al, or alloys thereof.

The magnetic films 211 to 213 are provided with vias V1 to V3, respectively, at a predetermined position therein. The vias V1 to V3 are formed by forming a through-hole at the predetermined position in the magnetic films 211 to 213 so as to extend through the magnetic films 211 to 213 in the T-axis direction and filling the through-holes with a conductive material. Each of the conductor patterns C11 to C14 is electrically connected to the respective adjacent conductor patterns through the vias V1 to V3. The conductor patterns C11 to C14 connected in this manner form the spiral coil conductor 225.

As shown in FIG. 7, the coil conductor 225 includes a winding portion 225A and lead-out conductors 225B. The winding portion 225A is wound spirally around the coil axis Ax extending along the thickness direction (the T direction), and the lead-out conductors 225B are led out from opposite ends of the winding portion 225A to connect the opposite ends to the external electrodes 221, 222, respectively. The lead-out conductors 225B include a first lead-out conductor 225b1 connecting one of the ends of the winding portion 225A and the external electrode 221 and a second lead-out conductor 225b2 connecting the other end of the winding portion 225A and the external electrode 222.

Similarly to the winding portion 25A, the winding portion 225A includes a plurality of first conductor portions and one or more second conductor portions smaller in number than the first conductor portions. The description on the coil conductor 25 also applies to the coil conductor 225 to a maximum extent. In the illustrated embodiment, the winding portion 225A includes four first conductor portions 225Aa1 to 225Aa4 and three second conductor portions 225Ab1 to 225Ab3. The first conductor portions 225Aa1 to 225Aa4 are example first conductor portions included in the winding portion 225A, and the second conductor portions 225Ab1 to 225Ab3 are example second conductor portions included in the winding portion 225A. In one embodiment, the number of first conductor portions included in the winding portion 225A ranges from two to five. In one embodiment, the number of second conductor portions included in the winding portion 225A is smaller by one than the number of first conductor portions. The number of second conductor portions included in the winding portion 225A ranges from one to four, for example.

More specifically, the winding portion 225A includes: the first conductor portion 225Aa1 connected to the second lead-out conductor 225b2 and extending from its connection with the second lead-out conductor 225b2 clockwise around the coil axis Ax; the second conductor portion 225Ab1 extending clockwise around the coil axis Ax from the end of the first conductor portion 225Aa1 opposite to its end connected to the second lead-out conductor 225b2; the first conductor portion 225Aa2 extending clockwise around the coil axis Ax from the end of the second conductor portion 225Ab1 opposite to its end connected to the first conductor portion 225Aa1; the second conductor portion 225Ab2 extending clockwise around the coil axis Ax from the end of the first conductor portion 225Aa2 opposite to its end connected to the second conductor portion 225Ab1; the first conductor portion 225Aa3 extending clockwise around the coil axis Ax from the end of the second conductor portion 225Ab2 opposite to its end connected to the first conductor portion 225Aa2; the second conductor portion 225Ab3 extending clockwise around the coil axis Ax from the end of the first conductor portion 225Aa3 opposite to its end connected to the second conductor portion 225Ab2; and the first conductor portion 225Aa4 extending clockwise around the coil axis Ax to its connection with the first lead-out conductor 225b1, from the end of the second conductor portion 225Ab3 opposite to its end connected to the first conductor portion 225Aa3. The first conductor portions 225Aa1 to 225Aa4 extend, as a whole, along the first side surface 210e, and the second conductor portions 225Ab1 to 225Ab3 extend, as a whole, along the second side surface 210f. If it is required to draw a boundary between the first conductor portions 225Aa1 to 225Aa4 and the second conductor portions 225Ab1 to 225Ab3, an imaginary plane VS1 passing through the coil axis Ax and parallel to the LT plane can be used as the boundary plane lying between the first conductor portions 225Aa1 to 225Aa4 and the second conductor portions 225Ab1 to 225Ab3.

The following describes how the coil conductor 225 is arranged relative to the magnetic base body 210 with reference to FIG. 7. FIG. 7 is a schematic plan view of the coil component 201 as viewed in the direction of the coil axis Ax. FIG. 7 shows the magnetic base body 210 and a transmission image of the coil conductor 225 as viewed in the direction of the coil axis Ax. In FIG. 7, the external electrodes 221, 222 are not shown for convenience of description. As described above, the ends of the generally ellipsoidal winding portion 225A are connected to the lead-out conductors 225B, and, in the winding portion 225A, the four first conductor portions 225Aa1 to 225Aa4 and the three second conductor portions 225Ab1 to 225Ab3 alternate with and are connected to each other. The coil conductor 225 is designed and arranged such that a distance D1 between the first conductor portions and the first side surface 210e is less than a distance D2 between the second conductor portions and the second side surface 210f. The first conductor portions 225Aa1 to 225Aa4 of the coil conductor 225 may be at least partially externally exposed on the first side surface 210e of the magnetic base body 210. The portion of the first conductor portions 225Aa1 to 225Aa4 that is externally exposed on the magnetic base body 210 may be covered with a magnetic layer. This magnetic layer may be made in the same manner as the magnetic layer 40.

Next, a description is given of an example manufacturing method of the coil component 201. The coil component 201 can be manufactured by, for example, a lamination process. An example is hereinafter described of the manufacturing method of the coil component 201 using the lamination process.

To begin with, magnetic sheets are formed, which are to be used as the magnetic films 218a to 218d constituting the top cover layer 218, the magnetic films 211 to 214 constituting the magnetic layer 220, and the magnetic films 219a to 219d constituting the bottom cover layer 219. These magnetic sheets are made of a composite magnetic material containing a binder and metal magnetic particles. The magnetic sheets for the coil component 201 may be made by the same method as the magnetic sheets used in the manufacturing process of the coil component 1.

After this, a coil conductor is made in the magnetic sheets. Specifically, a through-hole is formed in the respective magnetic sheets, which are to be used as the magnetic films 211 to 213, at a predetermined position so as to extend through the magnetic sheets in the T-axis direction. Following this, a conductive paste is printed by screen printing on the top surface of each of the magnetic sheets, which are to be used as the magnetic films 211 to 214, so that an unsintered conductor pattern is formed on each magnetic sheet. Also, the through-hole formed in each magnetic sheet is filled with the conductive paste.

Next, the magnetic sheets, which are to be used as the magnetic films 211 to 214 are stacked to obtain a coil laminated body. The magnetic sheets, which are to be used as the magnetic films 211 to 214, are stacked such that the unsintered conductor patterns C11 to C14 formed on the respective magnetic sheets are each electrically connected to the adjacent conductor patterns through the unsintered vias V1 to V3.

Following this, a plurality of magnetic sheets are stacked to form a top laminated body, which is to be used as the top cover layer 218. Similarly, a plurality of magnetic sheets are stacked to form a bottom laminated body, which is to be used as the bottom cover layer 219.

Next, the bottom laminated body, the coil laminated body, and the top laminated body are stacked in the stated order in the direction of the T axis from the negative side to the positive side, and these stacked laminated bodies are bonded together by thermal compression using a pressing machine to make a main laminated body. Instead of forming the bottom, coil and top laminated bodies, the main laminated body may be made by sequentially stacking all of the magnetic sheets prepared in advance and bonding the stacked magnetic sheets collectively by thermal compression.

Next, the main laminated body is segmented to a desired size by using a cutter such as a dicing machine or a laser processing machine to make a chip laminate. Next, the chip laminate is degreased and then heated. The end portions of the chip laminate are polished by barrel-polishing or the like, if necessary.

Next, a conductive paste is applied to both end portions of the chip laminate to form the external electrodes 221 and 222. The coil component 201 is obtained in the above-described manner.

Advantageous effects of the above embodiments will now be described. According to the coil component 1 relating to one of the embodiments of the present invention, the winding portion 25A of the coil conductor 25 is constituted by the first conductor portions 25Aa1 to 25Aa4 and the second conductor portions 25Ab1 to 25Ab3, which alternate with and are connected to each other. As no water can pass through the coil conductor 25, the first conductor portions 25Aa1 to 25Aa4 and the second conductor portions 25Ab1 to 25Ab3 serve as resistance or obstacles against the movement of the water. Here, the first conductor portions 25Aa1 to 25Aa4 are more than the second conductor portions 25Ab1 to 25Ab3. Therefore, when the water in the magnetic base body 10 moves from the inside of the winding portion of the coil conductor 25 to the outside of the magnetic base body 10, the water encounters difficulties in moving toward the first side surface 10e opposing the first conductor portions 25Aa1 to 25Aa4 but can easily move toward the second side surface 10f opposing the second conductor portions 25Ab1 to 25Ab3. When moving from within the magnetic base body 10 to the surface, the water may follow only some of the routes within the magnetic base body 10. If such is the case, these routes easily experience a rise in pressure, which is likely to create micro cracks near the routes in the magnetic base body 10. According to the above embodiments, the distance D1 between the first conductor portions 25Aa1 to 25Aa4 and the first side surface 10e of the magnetic base body 10 is less than the distance D2 between the second conductor portions 25Ab1 to 25Ab3 and the second side surface 10f of the magnetic base body 10. Accordingly, from the perspective of how far the water is required to move, the water encounters less resistance when taking the route extending from the region inside the winding portion (core portion) to the first side surface 10e than when taking the route extending from the core portion to the second side surface 10f. On the other hand, as described above, the first conductor portions 25Aa1 to 25Aa4 are more than the second conductor portions 25Ab1 to Therefore, from the perspective of the number or quantity of the conductors obstructing the movement of the water, the resistance against the movement of the water is greater in the route extending from the region inside the winding portion (core portion) to the first side surface 10e than in the route extending from the core portion to the second side surface 10f. According to the above embodiments, the resistance against the movement of the water determined by how far the water is required to move is balanced against the resistance against the movement of the water determined by the number of the conductors in the route. This allows the water to move from the core portion in the magnetic base body to the surface without following only one of the routes extending from the core portion to the first surface and the route extending from the core portion to the second surface. In other words, the water can move in a distributed manner in both of the routes. This can control micro cracks, which are attributable to the water following only some particular routes, from appearing. The above-described effects are also produced by the coil components 101, 201.

In the above embodiments of the present invention, the coil conductor 25, 125, 225 may be at least partially exter-nally exposed on the magnetic base body 10, 110, 210. According to these embodiments, the water contained in the magnetic base body 10, 110, 210 can more easily move toward the first side surface 10e, 110e, 210e.

The dimensions, materials, and arrangements of the constituent elements described for the above various embodiments are not limited to those explicitly described for the embodiments, and these constituent elements can be modified to have any dimensions, materials, and arrangements within the scope of the present invention. Furthermore, constituent elements not explicitly described herein can also be added to the above-described embodiments, and it is also possible to omit some of the constituent elements described for the embodiments.

What is claimed is:

1. A coil component comprising:
   a base body containing a plurality of metal magnetic particles and a binder binding together the metal magnetic particles, the base body having a first surface extending along a coil axis and a second surface opposing the first surface, the coil axis extending perpendicular to a mounting substrate on which the coil component is to be mounted;
   a first external electrode provided on the base body;
   a second external electrode provided on the base body; and
   a coil conductor electrically connected to the first and second external electrodes, the coil conductor extending around the coil axis,
   wherein the coil conductor has a winding portion, the winding portion has a plurality of first conductor portions opposing the first surface and one or more second conductor portions opposing the second surface and smaller in number than the first conductor portions, and the first and second conductor portions alternate with and are connected to each other, and
   wherein a first distance between the plurality of first conductor portions and the first surface is less than a second distance between the one or more second conductor portions and the second surface, and
   wherein a ratio of the first distance to the second distance is from 0.5 to less than 1.

2. The coil component of claim 1, wherein the ratio of the first distance to the second distance is at least 0.5 and a number of the plurality of first conductor portions is two.

3. The coil component of claim 1, wherein the ratio of the first distance to the second distance is at least 0.67 and a number of the plurality of first conductor portions is three.

4. The coil component of claim 1, wherein the ratio of the first distance to the second distance is at least 0.75 and a number of the plurality of first conductor portions is four.

5. The coil component of claim 1, wherein the ratio of the first distance to the second distance is at least 0.8 and a number of the plurality of first conductor portions is five.

6. The coil component of claim 1, wherein, in the coil conductor, a number of the one or more second conductor portions is smaller by one than a number of the plurality of first conductor portions.

7. The coil component of claim 1, wherein the base body further has a third surface connecting the first and second surfaces, a fourth surface opposite the third surface and connecting the first and second surfaces, and a fifth surface connecting the first, second third and fourth surfaces,
   the coil conductor extends around the coil axis and has first and second lead-out conductors, the first lead-out conductor including a first connection portion, the second lead-out conductor including a second connection portion, the first connection portion being exposed from the third surface so as to be electrically connected to the first external electrode, the second connection portion being exposed from the fourth surface so as to be electrically connected to the second external electrode.

8. The coil component of claim 7, wherein the first connection portion and the second connection portion are not exposed from the first surface and the second surface.

9. The coil component of claim 7, wherein the first connection portion is exposed further from the fifth surface.

10. The coil component of claim 7, wherein the second connection portion is exposed further from the fifth surface.

11. The coil component of claim 1, wherein the first conductor portions are at least partially externally exposed on the first surface of the base body.

12. The coil component of claim 11, wherein an externally exposed portion of the first conductor portions that is externally exposed on the base body is covered with an insulating film.

13. A DC/DC converter comprising the coil component of claim 1.

14. A circuit board comprising:
the coil component of claim 1; and
a mounting substrate soldered to the first and second external electrodes.

* * * * *